Sept. 16, 1958 R. A. HENLE ET AL 2,852,700

ELECTRIC CIRCUITS INCLUDING NON-LINEAR IMPEDANCE ELEMENTS

Filed Dec. 31, 1953

INVENTORS
RAYMOND W. EMERY
ROBERT A. HENLE

BY P. E. Henninger

ATTORNEY 2,852,700

ELECTRIC CIRCUITS INCLUDING NON-LINEAR IMPEDANCE ELEMENTS

Robert A. Henle, Hyde Park, and Raymond W. Emery, Poughkeepsie, N. Y., assignors to International Business Machines Corporation, New York, N. Y., a corporation of New York Application December 31, 1953, Serial No. 401,672

1 Claim. (Cl. 307—88.5)

This invention relates to electric circuits including transistors having non-linear base electrodes.

Such a transistor is described in U. S. Patent No. 2,609,428, issued to Harold B. Law on September 2, 1952. Conventional transistors have base electrodes whose impedance is linear, whereas transistors of the type described by Law have rectifying or asymmetrically conductive base electrodes. The Law type of transistor has a high current amplification characteristic due to the regenerative effect of the non-linear impedance of the asymmetric base electrode. These transistors are highly useful in many cases because of their high current amplification characteristics. These transistors show a greater current gain when operated without an ohmic base electrode, but under such conditions a decrease in the back impedance appears, which is especially undesirable in the "off" condition of the transistor. By back impedance is meant the impedance to the flow of current between the base and collector electrodes. This decrease in the back impedance results in a limitation of the range of usable collector potentials. The objectionable decrease in the back impedance does not appear when an ohmic base is used in parallel with the asymmetric base, but the current gain is not then as high.

An object of the invention is to provide an improved electric circuit for a transistor having an asymmetrically conductive base electrode.

A further object is to provide a circuit for a transistor of the type described, having favorable current gain characteristics similar to those obtained when an asymmetric base electrode is used alone without a parallel ohmic base, but not having the undesirable decrease in back resistance which is commonly encountered with such an arrangement.

The foregoing objects are attained in the circuit described herein by providing an ohmic base electrode in parallel with the asymmetric base electrode, and connecting in series with the ohmic base an asymmetric impedance element poled oppositely to the asymmetric base electrode and in parallel with that impedance element a circuit branch comprising a resistor and a battery in series, with the battery poled to bias the asymmetric impedance element in the forward direction.

Other objects and advantages of the invention will become apparent from a consideration of the following specification, taken together with the accompanying drawing.

Figure 1:
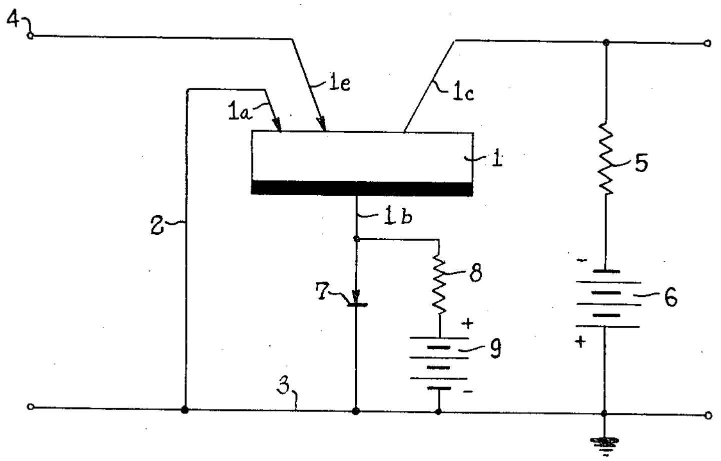
Fig. 1 is a wiring diagram of an electric circuit including a transistor of the Law type, and embodying the invention.

Referring to the drawing, there is shown in Fig. 1 a transistor having an emitter electrode 1*e*, a collector electrode 1*c*, an asymmetrically conductive base electrode 1*a* and an ohmic base electrode 1*b*.

The asymmetrically conductive base electrode 1*a* is connected directly to ground through wires 2 and 3. The collector electrode 1*c* is connected to ground through a load circuit including a resistor 5 and a battery 6.

The emitter 1*e* is shown as connected to an input terminal 4, in order to emphasize that the improvement of the present invention is particularly advantageous under "off" conditions, typically zero emitter current, or open-circuited emitter.

The ohmic base electrode 1*b* is connected to ground through two parallel branch circuits, one including an asymmetric impedance element 7 and the other including resistor 8 and a biasing battery 9.

Figure 2:
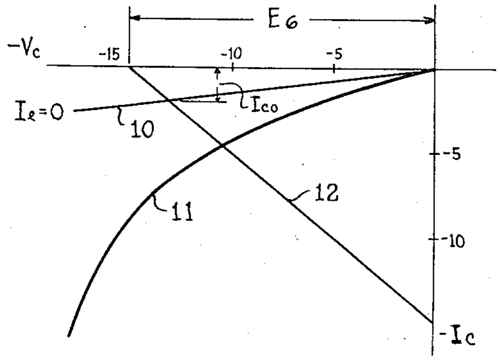
Fig. 2 is a graphical illustration of certain characteristics of the Law type of transistor.

In Fig. 2, there is illustrated at 10 the collector potential-current ($V_c$—$I_c$) characteristic of the transistor 1 of Fig. 1, taken for zero emitter current, with the ohmic base 1*b* and asymmetric base 1*a* both grounded. Line 11 of Fig. 2 illustrates the corresponding characteristics of the same transistor connected in a circuit without an ohmic base electrode. The decrease in back resistance at high negative collector potentials is readily apparent in curve 11. Transistors of this type exhibit much higher current gain characteristics when connected without an ohmic base electrode than when such an electrode is used.

The circuit illustrated in Fig. 1 has high current gain characteristics, without the objectionable decrease in back resistance illustrated by the curve 11.

The line 12 in Fig. 2 is a load line whose slope is determined by the impedance of resistor 5 and whose location is determined by its intersection with the $V_c$ axis, i. e., at a potential value equal to the potential of battery 6, as indicated by the legend $E_6$ in the drawing. The intersection of the zero emitter current characteristic 10 with the load line 12 determines the value of the collector current in the cutoff condition of the transistor, as indicated by the dimension $I_{co}$ in the drawing.

High current gain circuits such as those in which transistors of this type are employed are especially useful in switching circuits. Switching circuits may be defined as those which operate selectively at widely separated output conditions, i. e., widely separated values of output current and/or output potential. In such a circuit, the decrease in back resistance mentioned above is troublesome when the circuit is in its "off" condition, but is of less consequence when the circuit is in its "on" condition.

OPERATION

First consider the conditions in the loop including battery 9, resistor 8 and diode 7 when the transistor 1 is removed. The impedance of resistor 8 is selected high enough so that it maintains flow through that loop substantially constant, regardless of variations in the potential which may be applied to it. When the transistor is connected in circuit with the loop in question, the current flow through resistor 8 still maintains its substantially constant value. Under zero emitter current conditions, the total collector current is the current $I_{co}$ shown in Fig. 2. The resistor 8 and battery 9 are chosen so that the constant current flow through resistor 8 is greater than the cutoff collector current $I_{co}$, but relatively small as compared to the "on" collector current. Part of the current $I_{co}$ flows through the asymmetric base electrode 1*a* and part through the ohmic base electrode 1*b*. Since this latter current cannot flow through the diode 7, it represents a portion of the current flowing through resistor 8. The base 1*b* is then effectively grounded and the asymmetric base 1*a* is directly grounded so that the zero emitter current characteristic 10 applies to the transistor 1 and a high back impedance is obtained.

As the emitter current increases from zero, the collector current increases. Initially, both the current through asymmetric base 1*a* and ohmic base 1*b* increase. When the current flow through ohmic base 1*b* reaches a value such that it is equal to the constant current through resistor 8, then the resistor 8 will effectively prevent any further increase in the ohmic base current. Consequently, at a relatively small value of collector current a condition is established such that any further increase in the base current must pass through the asymmetric base electrode 1*a*. The current which flows through the asymmetric base 1*a* tends to cause increased current amplification of the transistor because of the hole (or minority carrier) injection properties of that contact. Consequently, after the predetermined small value of collector current is passed, the transistor has substantially the same current gain characteristics as would be obtained from the transistor without any ohmic base.

It may therefore be seen that the ohmic base is effectively in the circuit under cutoff conditions to maintain the back resistance of the transistor, but is effectively removed from the circuit at a low value of collector current so as to maintain the high current amplification characteristic of the transistor.

The following table shows by way of example, a particular set of values for the potentials of the various batteries and for the impedances of the various resistors, in a circuit which has been operated successfully. It should be understood that these values are set forth by way of example only and that the invention is not limited to these values or any of them. No values are given for the asymmetric impedance element, which may be considered to have substantially zero impedance in its forward direction and substantially infinite impedance in its reverse direction.

*Table I*

| | | |
|---|---|---|
| Resistor **5** | ohms | 1,000 |
| Battery **6** | volts | 15 |
| Resistor **8** | ohms | 24,000 |
| Battery **9** | volts | 45 |

While we have shown and described a preferred embodiment of our invention, other modifications thereof will readily occur to those skilled in the art and we therefore intend our invention to be limited only by the appended claim.

We claim:

A switching circuit shiftable between "off" and "on" conditions, comprising a transistor having a body of semiconductive material of uniform conductivity type, a first electrode in ohmically conductive contact with said body, second, third and fourth electrodes in asymmetrically conductive contact with said body, a current limiting resistor and a first source of unidirectional electrical energy connected in series between said first electrode and a common junction, a diode connected between said first electrode and said common junction and poled to be biased forwardly by said source, said diode, said limiting resistor and said source forming a loop, a load resistor and a second source of unidirectional electrical energy connected in series between said second electrode and said junction, said second source being poled to bias said second electrode reversely with respect to said junction, means directly connecting said third electrode and said junction, means connecting said fourth electrode to a signal source shiftable between "on" and "off" signal conditions, said first and third electrodes acting in parallel and conducting current between said body and said junction, said first source and said current limiting resistor being proportioned to limit the current flowing through said loop to a value slightly greater than the current flowing through said second electrode when said signal source is "off," said loop being effective when said signal source is "off" to carry substantially all the current flow between said body and said junction so that the transistor characteristics are then determined principally by said ohmically conductive first electrode, said loop being effective when the signal source is "on" to limit the increase in current through said first electrode so that substantially all the increase in current between body and junction due to the shift from "off" to "on" flows through said third electrode, and the transistor characteristics are then determined principally by said asymmetrically conductive third electrode.

References Cited in the file of this patent

UNITED STATES PATENTS

| | | |
|---|---|---|
| 2,570,978 | Pfann | Oct. 9, 1951 |
| 2,579,336 | Rack | Dec. 18, 1951 |
| 2,609,428 | Law | Sept. 2, 1952 |
| 2,622,211 | Trent | Dec. 16, 1952 |
| 2,629,833 | Trent | Feb. 24, 1953 |
| 2,662,976 | Pankove | Dec. 15, 1953 |